United States Patent [19]

Nagai

[11] Patent Number: 5,448,528
[45] Date of Patent: Sep. 5, 1995

[54] SYNCHRONOUS DRAM HAVING INITIAL MODE SETTING CIRCUIT

[75] Inventor: Eiichi Nagai, Kawasaki, Japan

[73] Assignee: Fujitsu Limited, Kawasaki, Japan

[21] Appl. No.: 307,420

[22] Filed: Sep. 19, 1994

[30] Foreign Application Priority Data

Sep. 21, 1993 [JP] Japan .................................. 5-235225

[51] Int. Cl.6 .............................................. G11C 13/00
[52] U.S. Cl. ................................. 365/233; 365/225.7; 365/230.06
[58] Field of Search ................. 365/233, 230.06, 225.7

[56] References Cited

U.S. PATENT DOCUMENTS 5,311,483  5/1994  Takasugi .......................... 365/233

Primary Examiner—Do H. Yoo
Attorney, Agent, or Firm—Nikaido, Marmelstein, Murray & Oram

[57] ABSTRACT

The initial mode setting circuit 30 has a circuit 31 for generating a reset pulse RST after detecting that the power source voltage VCC has reached a specified value when the power source voltage VCC starts up, and fuses 32 to 37, each one end of which is commonly connected to the output end of the reset signal generating circuit 31 and the other ends of which are connected to one of either the set input end S or the reset input end R of the flip flops 11 to 13. The fuses 32 to 37 are melted and cut off electrically or with a laser.

7 Claims, 4 Drawing Sheets

SYNCHRONOUS DRAM HAVING INITIAL MODE SETTING CIRCUIT

BACKGROUND OF THE INVENTION

The present invention relates to a synchronous DRAM that performs data input/output in sync with a clock and that has initial mode setting circuit.

With the increase in the system clock frequency of microprocessors, demand has risen for DRAM with which high-speed access is possible. In response to this demand, synchronous DRAMs have been developed.

A synchronous DRAM is provided with a mode register and by setting the burst length, wrap type and CAS latency in the register, optimal operation for the system can be achieved.

The burst length referred to here is the number of data that are input/output continuously and it can be set to 1, 2, 4, 8 or full page. Wrap type refers to the method with which column addresses which are internally generated are changed at the time of burst access. The sequential method, that changes column addresses continuously within the same bank, or the interleave method, that scrambles column addresses alternately between two banks can be selected for the wrap type. CAS latency refers to the number of clock cycles that pass after the read command is input until the time when the first data are read, and a latency of 1, 2 or 3 can be selected.

FIG. 4 is a simplified illustration of a circuit in the prior art that is related to mode setting within a synchronous DRAM.

The mode register 10 is provided with 3-bit D flip flops 11 to 13. The outputs from the D flip flops 11, 12 and 13 respectively indicate the burst length, wrap type and CAS latency. FIG. 4 is simplified, but in fact, one flip flop is provided for each of the 1, 2, 4, 8 and full page burst lengths and this applies to other modes.

Each of the AND gates 21 to 23 is opened by the mode register setting signal MRS and their outputs are determined by the values of the 7-bit addresses A0 to A6. The mode register setting signal MRS is an output of the AND gate 25 and it is set to '1' when the chip select signal *CS, the row address strobe signal *RAS, the column address strobe signal *CAS and the write enable signal *WE are all set to '0'. Generally speaking, a signal *S means the signal whose logical value is in inverse relation to a signal S.

In the structure described above, with a program, by setting the chip select signal *CS, the row address strobe signal *RAS, the column address strobe signal *CAS and the write enable signal *WE to '0' for the synchronous DRAM, and at the same time, by assigning specific address values A0 to A6, the appropriate operation mode can be set in the mode register 10.

Generally, a DRAM cannot be accessed immediately after the power source voltage VCC starts up, as shown in FIG. 3A. Namely, after the power source voltage VCC reaches a specified value, such as 3.3 V±0.3 V, 200 μs, i.e., the time that is required for the substrate bias circuit within the DRAM to stabilize, is allowed to pass. Further, it is necessary to perform dummy operations for 8 cycles in order to set the potential of the sequential logic circuit to a normal level. In the case of synchronous DRAM, furthermore, one clock cycle for the mode setting described above and three clock cycles for awaiting stabilization of the voltage level of the signal related to the setting are required, so a total of 4 additional clock cycles is required.

Because of this, a long time must elapse after power up before access is enabled, and it is necessary to set the mode with an initialization routine or the like before the memory can be accessed after power up.

SUMMARY OF THE INVENTION

In view of the prior art described above, an object of the present invention is to provide a synchronous DRAM which can reduce the length of time that elapses after power up until access is enabled and which can eliminate initial mode setting using a program.

According to the present invention, there is provided a synchronous DRAM performing data input or output operation synchronized with a clock input in one of operating modes, the mode being set in a mode register, comprising: a command decoder for decoding a control signal from outside to generate a mode register setting signal and for, when said mode register setting signal is active, decoding an memory address to set the operating mode in the mode register; and a initial mode setting circuit for generating a reset signal after detecting that a power source voltage has reached a value after start up of said power source voltage and for setting an initial value of the operating mode in said mode register with timing of said reset signal.

Since the operating mode that the user normally uses or that the user requests can be initially set in the mode register automatically in response to the reset signal that is generated at power up, access becomes possible after, for example, 8 dummy cycles. This means, as shown in FIG. 3B for example, that access is possible by four clock cycles sooner than in the prior art, just as with non-synchronous type DRAM.

Also, it is not necessary to set initial mode in an initialization routine or the like.

In the first mode of the present invention, said mode register has flip flops, each of said flip flops has a set input end and a reset input end; said initial mode setting circuit comprises; a reset signal generating circuit for generating a reset pulse from an output end after detecting that said power source voltage has reached a value when said power source voltage starts up; and non-volatile switching elements, one end of each of which being commonly connected to said output end of said reset signal generating circuit and another end of each of which being connected to one of either said set input end or said reset input end of one or more of said flip flops.

By this first mode, It becomes possible to set an initial value for the operating mode easily in correspondence with the system being used by the synchronous DRAM user.

In the second mode of the present invention, said flip flops are N number; and said non-volatile switching elements are 2N number, one end of each of which being commonly connected to said output end of said reset signal generating circuit and other ends of which being connected to said set input ends or said reset input ends of said flip flops respectively.

This second mode simplifies the structure.

In the third mode of the present invention, said non-volatile switching elements are fuses cut off or not in accordance with said initial mode.

This third mode makes possible to set various initial mode by melting and cut off electrically or with a laser in accordance with user's request.

In the forth mode of the present invention, said non-volatile switching elements are wiring pattern having connection/disconnection between said ends in accordance with said initial mode.

This third mode simplifies the structure.

As other mode, each of said non-volatile switching elements comprises a switching transistor connected between said output end of said reset signal generating circuit and said set input end or said reset input end of one of said flip flops.

DESCRIPTION OF THE PREFERRED EMBODIMENT

Figure 2:
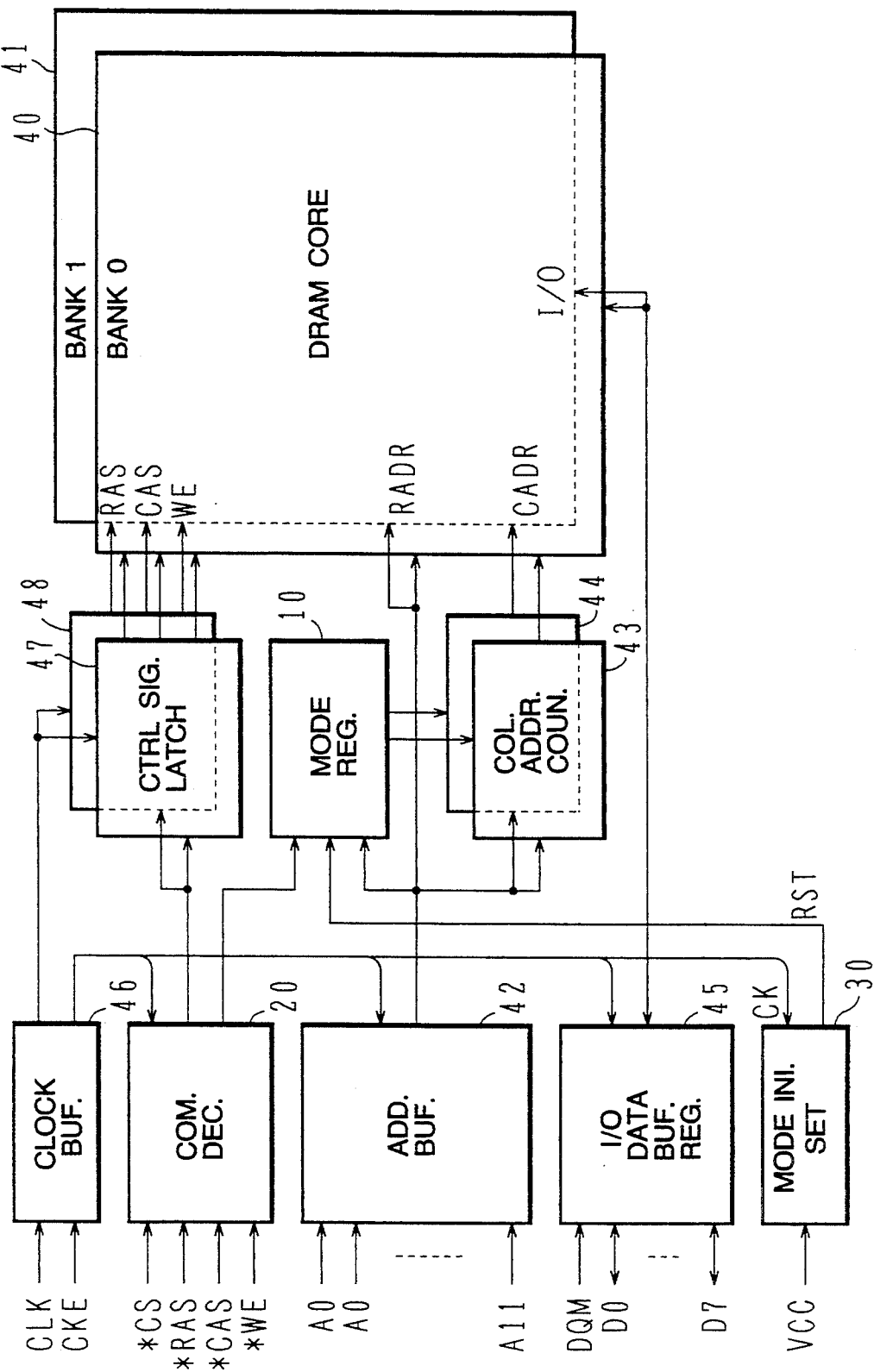
FIG. 2 is a block diagram showing the overall configuration of a synchronous DRAM that includes the circuit shown in FIG. 1.

FIG. 2 shows an overall configuration of the synchronous DRAM.

This synchronous DRAM is provided with the DRAM core 40 of bank 0 and the DRAM core 41 of bank 1. The addresses A0 to A11 are supplied to the row address input ends RADR of the DRAM cores 40 and 41 via the address buffer 42. When the address bit A11 is set to '0', the DRAM core 40 is selected and when the address bit A11 is set to '1', the DRAM core 41 is selected. The addresses A0 to A11 that are supplied next are held in the column address counters 43 and 44 via the address buffer 42 and their contents are supplied to the column address input ends CADR of the DRAM cores 40 and 41. The contents of the column address counters 43 and 44 are counted up during a burst transfer in correspondence with the mode set in the mode register 10. Input/output of the data D0 to D7 for the data input/output ends I/O of the DRAM cores 40 and 41 is performed through the input/output data buffer register 45. The control of data input/output is executed, in sync with the clock CLK supplied to the clock buffer 46, based upon the chip select signal *CS, the row address strobe signal *RAS, the column address strobe signal *CAS and the write enable signal *WE that are supplied to the command decoder 20.

If any of the chip select signal *CS, the row address strobe signal *RAS, the column address strobe signal CAS or the write enable signal *WE are not set to '0', they are held in the control signal latch circuit 47 and 48 by the clock from the clock buffer 46 and they are then supplied to the row address strobe signal input end RAS, the column address strobe signal input end CAS and the write enable signal input end WE of the DRAM cores 40 and 41. The clock CLK becomes validated in the clock buffer 46 when the clock enable signal CKE is set to '1'.

In addition to the structure of the known art described above, this embodiment is further provided with the initial mode setting circuit 30 that performs initial setting of the mode, that is normally used in the system, in the mode register 10 at the time of power up.

Figure 1:
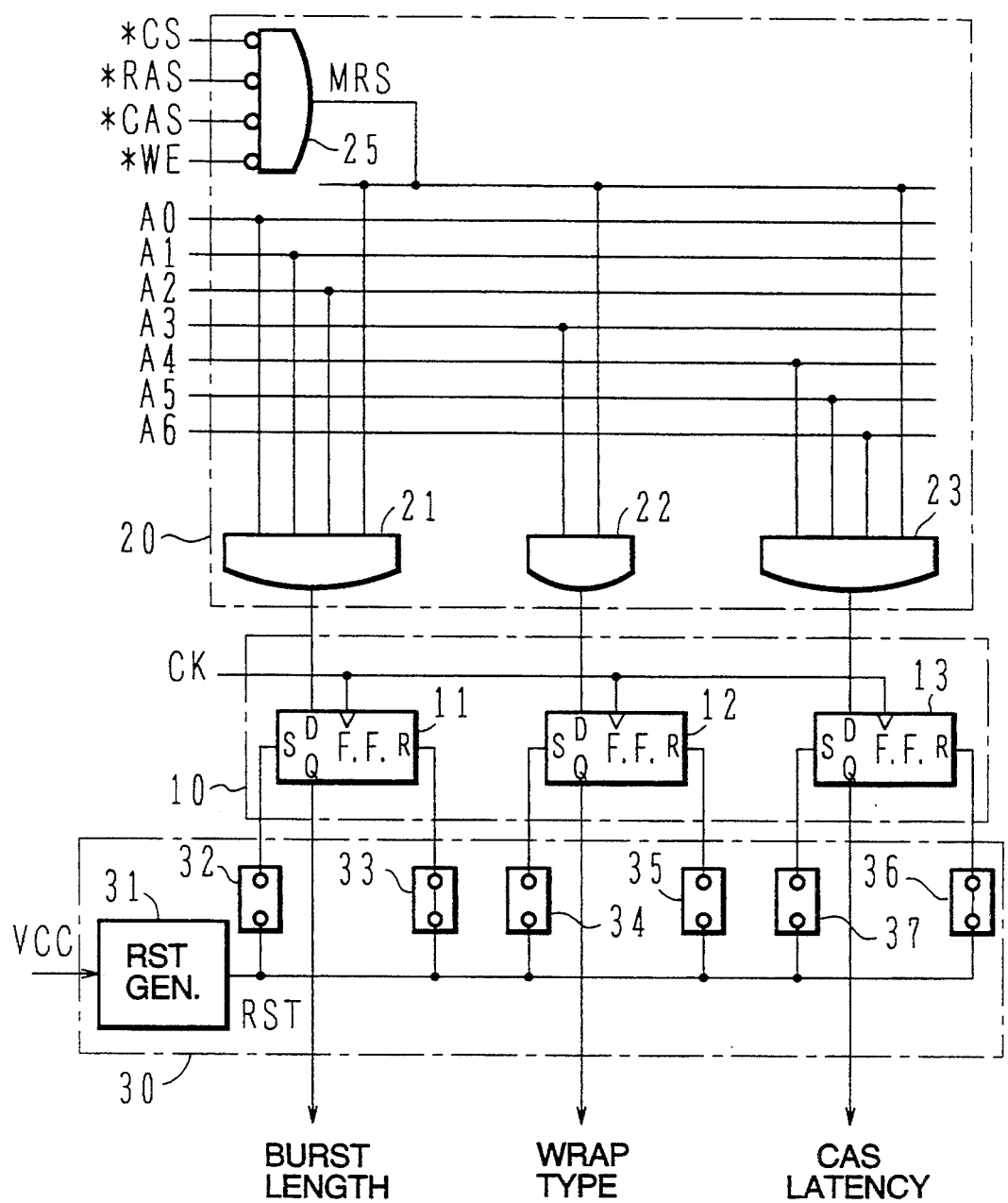
FIG. 1 shows a circuit that is related to mode setting within the synchronous DRAM in an embodiment of the present invention.

As shown in FIG. 1, the initial mode setting circuit 30 is provided with a reset signal generating circuit 31 that generates a one-pulse reset signal RST that is output at start up after detecting that the power source voltage VCC has reached a specified value in the range of, for example, 3.3 V±0.3 V and non-volatile switching elements 32 to 37, one end of each being connected commonly to the output end of the aforesaid reset signal generating circuit 31 and the other ends being connected to the set input ends and the reset input ends of the D flip flops 11, 12 and 13 respectively.

The non-volatile switching elements 32 to 37 may be fuses that can be melted and cut off electrically or with laser or they may be a wiring pattern in which connection/disconnection can be selected at layout design. Either one of 32 or 33, either one of 34 or 35 and either one of 36 or 37 of the non-volatile switching elements 32 to 37 are fused or disconnected depending upon the operating mode that is normally used by the user or requested by the user. In FIG. 1, the non-volatile switching elements 33, 35, and 37 are set to ON and the non-volatile switching elements 32, 34, 36 are set to OFF.

The clock CK is supplied from the clock buffer 46 shown in FIG. 2 to clock input ends of D flip flops 11 to 13 when setting is made in the mode register 10 with a program as in the prior art.

Figure 4:
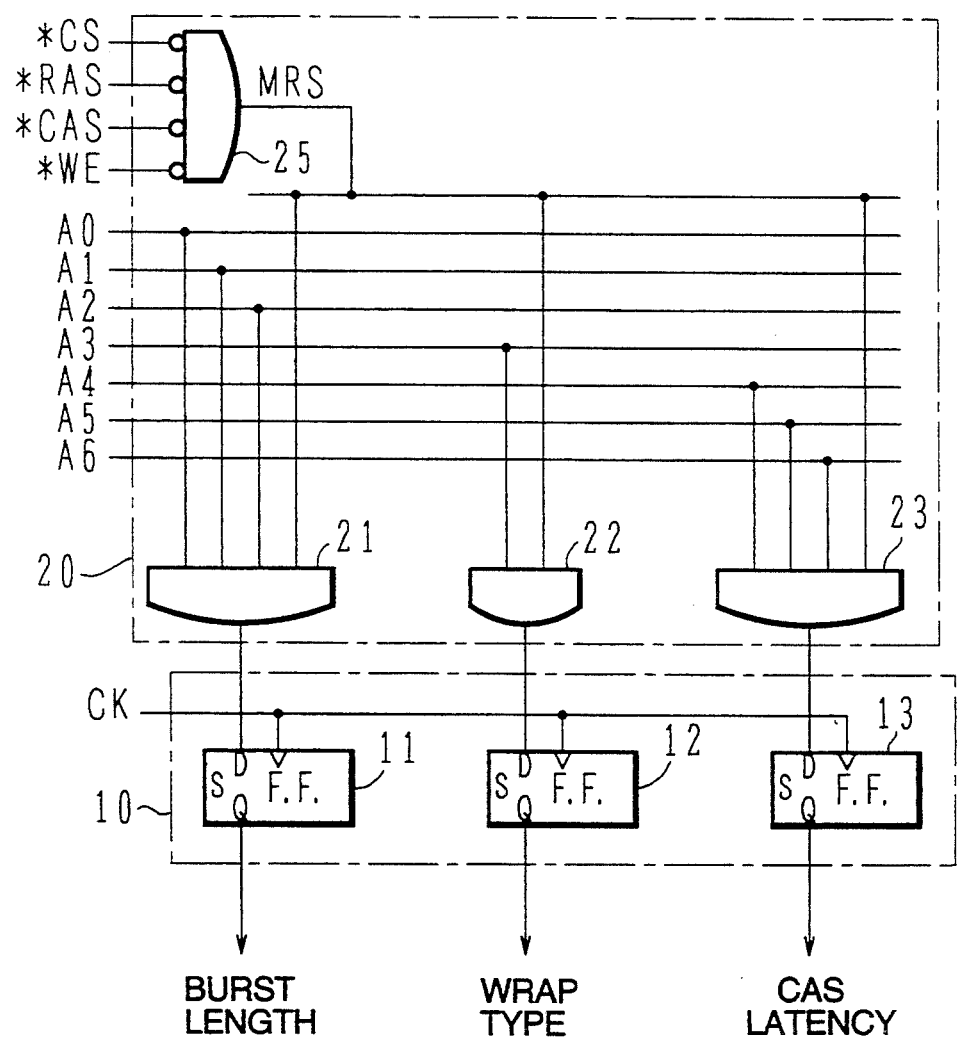
FIG. 4 shows a circuit that is related to mode setting within the synchronous DRAM in the prior art.

The other aspects of FIG. 1 are identical to those in FIG. 4.

Next, the operation of the embodiment structured as described above is explained.

Figure 3A:
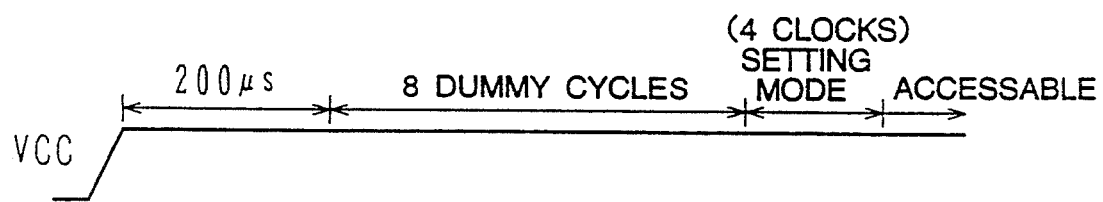
FIG. 3A is a waveform diagram of the process leading to the time when access is enabled in the prior art.
Figure 3B:
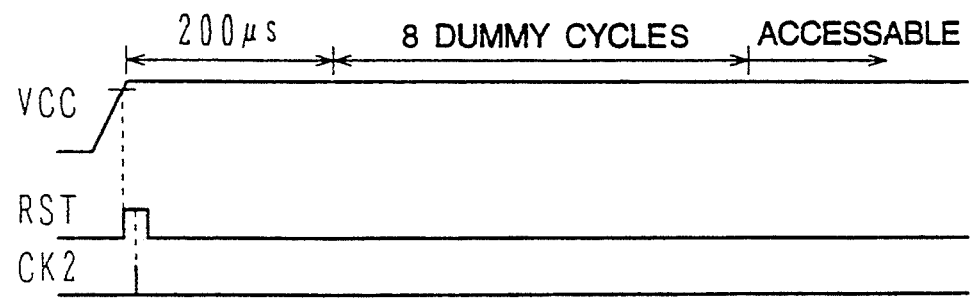
FIG. 3B is a waveform diagram of the process leading to the time when access is enabled in an embodiment of the present invention.

In FIGS. 1 and 3B when the power source voltage VCC is started at power up and reaches a specified value in the range such as 3 V±0.3 V, a reset signal RST is output from the reset signal generating circuit 31, which then is supplied to the reset input end of the D flip flops 11 to 13 of the mode register 10 to clear the contents of D flip flops 11 to 13 to 0. With this, the burst length, the wrap type and the CAS latency that are normally used by the user or which are requested by the user are initially set.

Since the 8 dummy clock cycles and 200 μs shown in FIG. 3B relate to a memory cell array, normal access cannot be made to the memory cell array while the dummy cycles are running. However, since the setting in the mode register 10 does not constitute an access to the memory cell array, mode setting can be made immediately after the power source voltage VCC starts up as described above.

With the present embodiment, since the operating mode that the user normally uses or the user requests is initially set in the mode register automatically in responce to the reset signal RST that is generated with power up, access becomes possible after 8 dummy clock cycles just as with non-synchronous DRAM. This means that access is possible sooner by four clock cycles compared to the prior art. Also, it is not necessary to perform initial mode setting in an initialization routine or the like.

Having described specific embodiment of the present invention, it is to be understood that modification and variation of the invention are possible without departing from the spirit and scope thereof.

What is claimed is:

1. A synchronous DRAM performing data input or output operation synchronized with a clock input in one of operating modes, the mode being set in a mode register, comprising:
- a command decoder for decoding a control signal from outside to generate a mode register setting signal and for, when said mode register setting signal is active, decoding a memory address to set the operating mode in the mode register; and
- an initial mode setting circuit for generating a reset signal after detecting that a power source voltage has reached a value after start up of said power source voltage and for setting an initial value of the operating mode in said mode register with timing of said reset signal.

2. A synchronous DRAM according to claim 1:
wherein said mode register has flip flops, each of said flip flops has a set input end and a reset input end;
wherein said initial mode setting circuit comprises;
a reset signal generating circuit for generating a reset pulse from an output end after detecting that said power source voltage has reached a value when said power source voltage starts up; and
non-volatile switching elements, one end of each of which being commonly connected to said output end of said reset signal generating circuit and another end of each of which being connected to one of either said set input end or said reset input end of one or more of said flip flops.

3. A synchronous DRAM according to claim 2 wherein said on-volatile switching elements are fuses cut off or not in accordance with said initial value of the operating mode.

4. A synchronous DRAM according to claim 2 wherein said non-volatile switching elements are wiring patterns having connection/disconnection between said output end of said reset signal generating circuit and said one of either said set input end or said reset input end of one or more of said flip flops in accordance with said initial value of the operating mode.

5. A synchronous DRAM according to claim 2:
wherein said flip flops are N number; and
wherein said non-volatile switching elements are 2N number, one end of each of which being commonly connected to said output end of said reset signal generating circuit and other ends of which being connected to said set input ends or said reset input ends of said flip flops respectively.

6. A synchronous DRAM according to claim 5, wherein said non-volatile switching elements are fuses cut off or not in accordance with said initial value of the operating mode.

7. A synchronous DRAM according to claim 5 wherein said non-volatile switching elements are wiring patterns having connection/disconnection between said output end of said reset signal generating circuit and said one of either said set input end or said reset input end of one or more of said flip flops in accordance with said initial value of the operating mode.

* * * * *